United States Patent [19]

Eidschun, Jr.

[11] 4,036,705

[45] July 19, 1977

[54] METHOD FOR METAL EXCHANGE

[76] Inventor: Charles Douglas Eidschun, Jr., 11004 64th Terrace, North, Seminole, Fla. 33542

[21] Appl. No.: 580,304

[22] Filed: May 23, 1975

Related U.S. Application Data

[63] Continuation-in-part of Ser. No. 502,536, Sept. 3, 1974, abandoned.

[51] Int. Cl.² .......................... C25D 5/02; C25D 5/06
[52] U.S. Cl. .................................. 204/15; 204/224 R; 204/225
[58] Field of Search ...................... 204/224 R, 15, 206, 204/225

[56] References Cited

U.S. PATENT DOCUMENTS

| 936,472 | 10/1909 | Pfanhauser | 204/206 |
|---|---|---|---|
| 3,048,528 | 8/1962 | Covington | 204/224 R |
| 3,374,159 | 3/1968 | Poole | 204/224 R |
| 3,661,752 | 5/1972 | Capper et al. | 204/206 |
| 3,933,615 | 1/1976 | Levenson | 204/275 |

Primary Examiner—T. M. Tufariello
Attorney, Agent, or Firm—Jack E. Dominik

[57] ABSTRACT

A method of plating is shown in which a pair of counter-rotating rollers are positioned above an electrolyte tank and a printed circuit board inserted therebetween in electroplating relationship. Metering rollers are provided at opposed stations outboard of the plating rollers to express electrolyte therefrom, preferably in yieldable relationship with the plating rollers. Masking rollers are provided directly above the plating rollers, and a film is rolled on the masking rollers for lowering into the position between the plating rollers to thereby mask the surface being plated and control the amount of plating. The unit is provided with a dust cover having an insert slot in a medial portion. The method contemplates the plating of, or removal of metal from, members which are capable of being positioned between a pair of opposed rotating rollers. The method also relates to the utilization of film-like members for masking the area which is plated or from which metal is removed. Light wiping contact with the surface to be plated by an electrolytic carrying material on the rollers is also shown.

15 Claims, 7 Drawing Figures

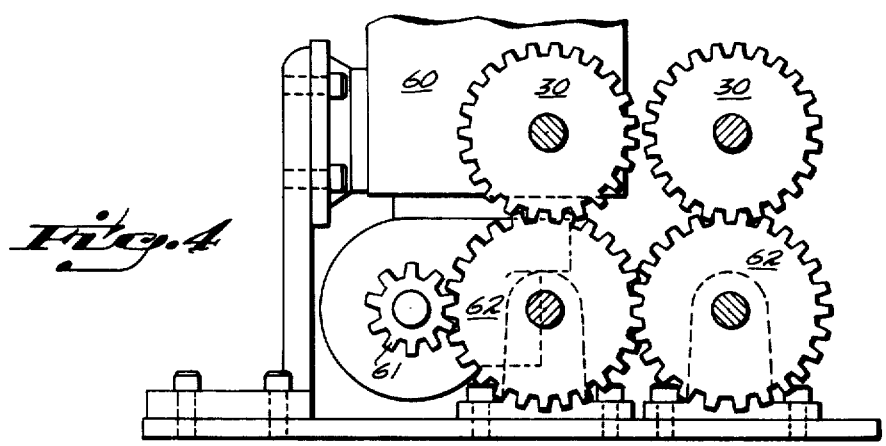
Fig. 4
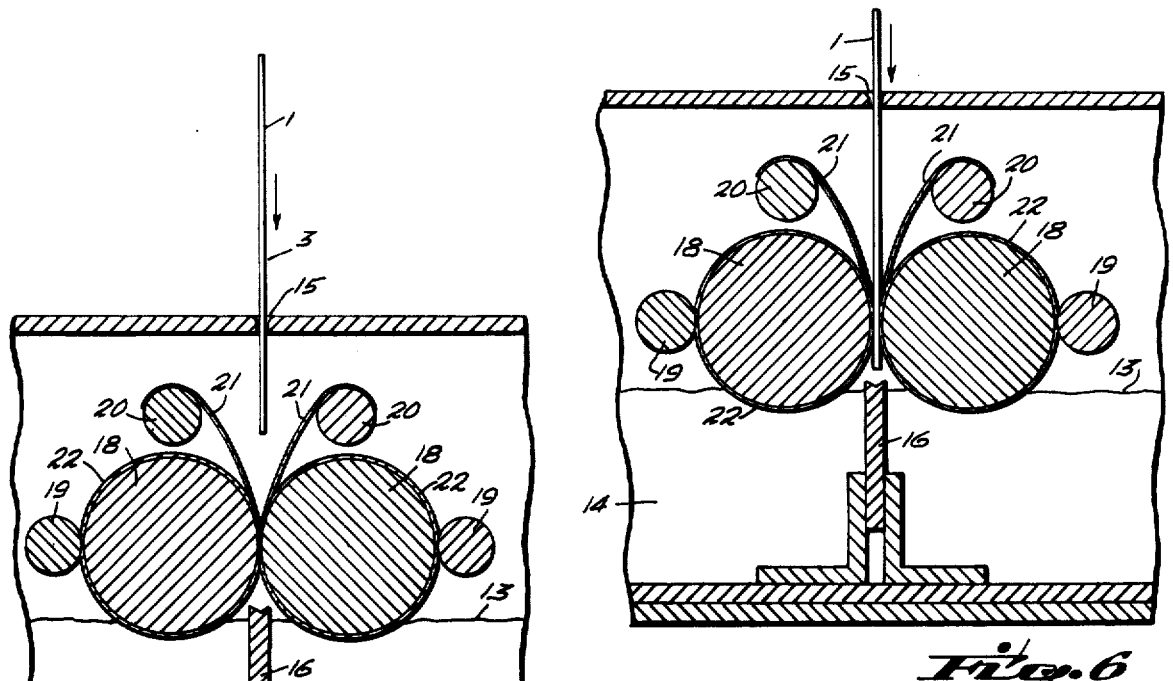
Fig. 5
Fig. 6
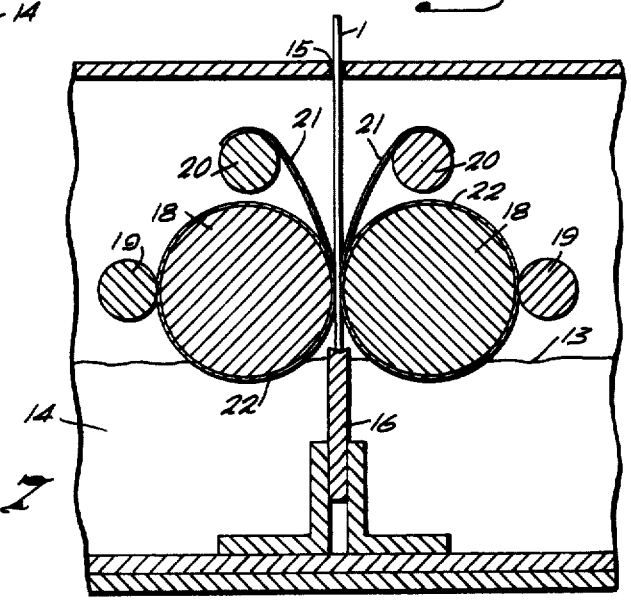
Fig. 7

METHOD FOR METAL EXCHANGE

BACKGROUND OF THE INVENTION

Related Applications

This application is a continuation-in-part of an earlier filed U.S. patent application Ser. No. 502,536 filed Sept. 3, 1974, (now abandoned) by the applicant herein, entitled METHOD AND APPARATUS FOR RAPID SELECTIVE AREA ELECTRODEPOSITION OF HIGH QUALITY DEPOSIT.

Field of the Invention

The present invention relates generally to the field of electroplating, and finds particular utility in connection with the electroplating of gold contact areas on printed circuit boards. The prior art may be located in Class 204, Subclasses 206, 224R and others.

Description of the Prior Art

The prior art is exemplified in U.S. Pat. Nos. 936,472 and 3,661,752; as well as French Pat. No. 331,930 and Patents in Great Britain Pat. Nos. 760,016 and 18,643 (the latter published in 1899).

In the plating type devices of the prior art, rotary members for light frictional engagement with the cathode are shown. The puprose of the light contact is to wipe away bubbles, electrodeposition, and the like to the end that the electroplating action may proceed readily without contamination or film barriers on the surface to be plated. The prior patents, however, fail to deal with the modern problems of gold plating contacts on printed circuit boards, where the value of the electrolyte solution in metal is very high. The price of gold has escalated to the point where the loss of one ounce becomes a very expensive proposition. Printed circuit boards are gold plated presently by dipping the same as a cathode into an anode bath, and crudely determining the time that the printed circuit board is in the bath to plate the contact points. The problem with this approach is that the points can be overplated or underplated, since there is no means for determining the surface plating action due to the lack of a wiping contact to maintain a consistant surface. Furthermore, it is difficult to mask the printed circuit board for printing only that portion necessary to the completed product, usually, a band of approximately three-quarters of an inch long, and with a thickness of gold which can be measured in the millionths of an inch.

SUMMARY OF THE INVENTION

The present invention is based upon the discovery that opposed rollers having an electrolytic wiping type surface can pass in electrolytic contact with a surface to be plated, or from which metal is to be removed, and in a controlled fashion remove or plate the exact amount of predetermined metal to the surface. The opposed rollers preferably counter-rotate and are in tangential contact with a workpiece inserted between the rollers. The workpiece is jigged to fix an area of metal exchange on the workpiece, and moved in a plane passing between the rollers at the point of tangency. In all instances, the contact between the rollers and the electrolytic solution is timed in proportion to the current path and concentration of electrolytic solution.

The apparatus and method further comtemplate the utilization of a masking film positioned in opposed relationship to the workpiece and in masking relationship to a portion of the rollers to thereby determine an exact line of the stripe to be plated. In the device, the film is positioned and rolled on masking rollers which are positioned above the plating rollers. In addition, metering rollers, preferably in yieldable relationship, at opposed stations outboard of the plating rollers to adjust the amount of electrolyte expressed from the plating rollers prior to the electrolytic contact with the workpiece and also to assist in providing an adjustable yieldable pressure between the rollers. In addition, means are provided to adjust the spaced relationship between the rollers and the workpiece. In a detailed embodiment, means are also provided to adjust the jig at both ends from a position within the electrolyte tank and beneath the opposed position of the plating rollers.

In view of the foregoing, it is a principal object of the present invention to provide a method and apparatus for plating in which workpieces such as a printed circuit board can be dropped into a slot, placed there for a finite period of predetermined time, and removed with a precise area gold plated to a predetermined thickness with repeatable accuracy.

Still another object of the present invention is to provide a method and apparatus for plating, particularly for plating gold onto contact points of printed circuit boards, in which the amount of gold lost in the electrolyte, or lost by overplating the contact points, is held to an irreducable minimum, thereby maximizing the use of the electrolytic gold, and minimizing the cost of the plating.

Still another object of the present invention is to provide a method and appartus for plating which can be used by semi-skilled workers, with a modest amount of training, with the same efficiency or better efficiencies than preexisting methods with skilled platers.

Still another object of the present invention is to provide a method and apparatus for plating which is inherently economical from the standpoint of the construction of the machine for doing the plating, and its operation.

A more detailed object of the present invention is to provide a method and apparatus for plating which is adjustable in all of its critical relationships, and an addition which can be readily disassembled for replacement of various parts, servicing, and for preadjusting to various work runs.

Another important object of the present invention is to provide a method and apparatus for plating in which the masking of the particular part can be adjusted quickly in changing from part to part, and where the mask is a relatively permanent portion of the method and apparatus, and consequently, does not have to be particularly designed, cut, and applied for each application.

DESCRIPTION OF THE DRAWINGS

The foregoing objects and advantages of the present invention will be more fully understood as the following description of a preferred method and apparatus proceeds, taken in conjunction with the accompanying drawings, in which:

FIG. 4 is a rear-end view, partially broken and enlarged, of the apparatus shown in FIGS. 2 and 3, illustrating the drive train and motor for driving the plating rollers counter-rotating fashion.

FIGS. 5, 6 and 7 are sequential partially diagrammatic views taken in enlarged fashion at the central portion of the transverse section shown in FIG. 1; FIG. 5 illustrating a typical printed circuit board before insertion; FIG. 6 illustrating the printed circuit board as is being inserted, and FIG. 7 illustrating the printed circuit board in plating relationship as jigged within the unit, and appropriately masked for precisely limiting the upper reaches of the stripe to be plated.

METHOD

Figure 1:
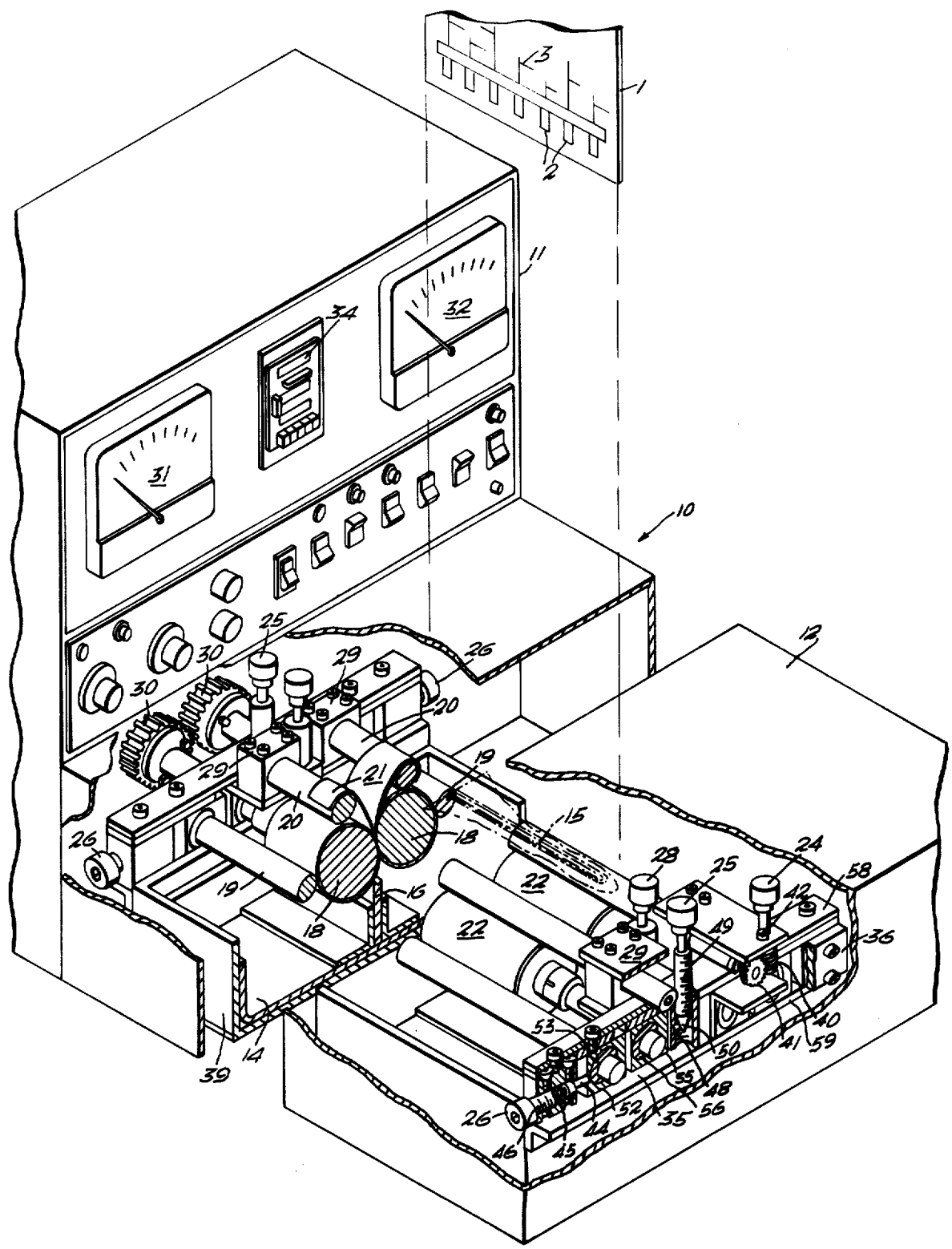
FIG. 1 is a prospective broken partially sectioned view of the plating apparatus showing a typical printed board in opposed but insert relationship therewith.

The method contemplated by the present invention is best illustrated in FIGS. 5, 6 and 7, where it will be seen that a printed circuit board 1, having a plurality of contacts 2 is inserted into position between a pair of rollers 18. The printed circuit board 1 is masked by means of the film 21 which is dropped down from the rollers 20 to overlappingly mask off that portion of the contacts to the printed circuit board 1 which are to be plated. The method includes the step of positioning the plating rollers 18 in an electrolyte 13 in the electrolyte tank 14. A further method step includes supporting the printed circuit board 1 in a predetermined position in relationship to the opposed plating rollers 18. In this instance, the supporting step is accomplished by means of a stop 16 which is beneath the surface of the electrolyte 13. A further step to improve the quality of the plating includes expressing the electrolyte 13 from the surface 22 of the plating rollers, in this instance, the step is accomplished by means of the metering rollers 19. A further more detailed step in accomplishing the method is to drop the masking film 21 by means of positionable masking rollers 20 to precisely locate the upper line of plating on the contacts 2 of the printed circuit board 1.

A further step in the method may be accomplished by the step of reversing the counter-rotation of the plating rollers 18 after the plating has been concluded, and if the original wiping effect to yieldably urge the printed circuit board 1 toward the stop 16, reversing the plating meters 18 will direct the circuit board out from contact with the plating roller. Finally, a desirable step is to provide lateral support for the printed circuit board 1, here shown by means of the insert slot 15, at a position remote from the jigging means to thereby secure the printed circuit board 1 against dislodgment during the time while the same is being plated.

The precise concentration of the electrolyte 13 as well as speed of rotation of the plating rolls 18, their direction of rotation, and the amount of current applied can be determined empirically. What is significant is that the method and the apparatus of the present invention will permit repeatability once the concentration of electrolyte is determined, as well as time and current concentrations, to five-millionths of an inch of plating build up, or removal of metal. In the latter connection, it must be borne in mind that in many applications, where scrap is to be recovered, it may require removing the plating from a subject such as a printed circuit board. By reversing the polarity of the printed circuit board 1 and the plating rolls 18, the rolls may be used to remove gold or other metal (irrespective of whether plated, inlaid, or wrought in place) from the printed circuit board 1 or other workpiece in the same fashion that the same can be applied. While the method has been described as highly desirable for use in connection with gold plating, it will be appreciated that plating with other metals can also be employed. The dramatic savings in costs, however, occurs when the metal being plated is the most expensive, and accordingly, the advantages of the invention in connection with gold plating are economically highly significant.

DETAILED DESCRIPTION OF THE PREFERRED EMBODIMENTS

As noted in connection with the description of the method above, the plater 10 as shown in FIG. 1, contemplates the insertion of a printed circuit board 1, having contact fingers 2 and a circuit 3 through an insert slot 15 for purposes of plating a stripe on the contact fingers 2. Normally, the stripe is approximately ¾ inch in length. The printed circuit board is then inserted through the slot 15 and ultimately rests on the printed circuit board stop 16. The control box 11 contains the D.C. volt meter 31, the D.C. ammeter 32, and the ampere-minute meter 34 as well as related switches for purposes of controlling the amount of current and the timing for the plating cycle. The invention is not directed specifically to the concentration of electrolyte 13 or the current or timed relationships involved in the plating. To be further noted is the positioning of a dust cover 12 around the entire contents of the plater 10, primarily to protect the same from contamination. The dust cover 12 may be removed for purposes of adjustment prior to each run in order to obtain the proper relationships between the parts and preset the same for such a production run. The plating tank 14 is provided at the lower portion of the unit, and as indicated above, the printed circuit board stop 16 is in the plating tank and preferably positioned so that its upper edge is above the surface of the electrolyte 13, but below the tangential contact point of the rollers.

A pair of opposed plating rollers 18 are provided which are rotatably secured at their ends, preferably in oil sealed bearings. The purpose of the oil seal in the bearing is not so much directed to the lubrication, but rather to avoiding contamination of the electrolyte 13 by any lubricants. Opposed metering rollers 19 are provided along the common diameter of the plating rollers 18 as the same is extended. The masking rollers 20 are provided in spaced relationship and directly above the plating rollers 18 and secured at their ends by means of the mask roller spacer 29. The mask 21 may be a sheet of Mylar or other flexible or resilient material, rolled around the masking roller 20. Here the same is shown as rotated in a counterclockwise direction around the right-hand masking roller, but the same can be reversed. The mask 21 should be positioned, however, to drop down from the opposed positions on the opposed masking rollers 20 to a point generally at the tangency between the opposed plating rollers 18.

The rollers 18 are covered with a sleeve or sock 22 which will absorb the electrolyte 13, and from which the same can be expressed by means of the metering rollers 19 to the proper density at the point of plating. The roller sleeve 22 can be formed of felt, such as ⅛ inch SAE F10, although ⅛ inch SAE F5 will also operate satisfactorily on certain types of plating operations.

Knitted nylon and dacron, such as employed in men's stockings of the fixed dimension or stretched type, will also work in several applications. Cotton sleeves have also been found satisfactory, but a material which will shrinkingly engage the plating roller is more desirable.

For purposes of adjustability, it will be noted that the mask 21 can be adjustable upwardly and downwardly by the mask adjustment 24. The plating roller adjustment 25 is positioned between the two plating rollers 18 and adjustably, from both ends of the rollers, can space the same further apart as will be described in greater detail hereinafter. Finally, it will be noted that four metering adjustment rollers are provided at the four corners of the interior members, the same adjusting the compressability of a spring 45 (see FIG. 3) to yieldably urge the metering rollers 19 into electrolyte expressing relationship with the sleeve 22 on the plating roller 18. Finally, stop adjustments 28 are also provided at opposed stations along the printed circuit board stops 16 for purposes of raising and lowering the same, thereby permitting the adjustment to be made at either or both ends of the stop 16.

The plating rollers 18 are the driven members, and are rotated by means of the driven spurs 30. The drive mechanism is shown more completely in FIG. 4, where it will be seen that the driven spurs 30 are engaged by the transfer gear 62 which are meshing relationship each to the other, and to the driven spurs 30. The driven spurs 30, however, do not mesh since they are proportioned and oriented for counter-rotation. The motor 60 operates through a speed reducer to drive the driving spur 61 which engages the transfer gears 62. As pointed out above in connection with the method, electrical circuit means can be provided which, upon conclusion of the plating, can be reverse the direction of counterrotation of the plating rollers 18 to elevate the printed circuit board 1 upwardly through the insert slot 15.

Figure 2:
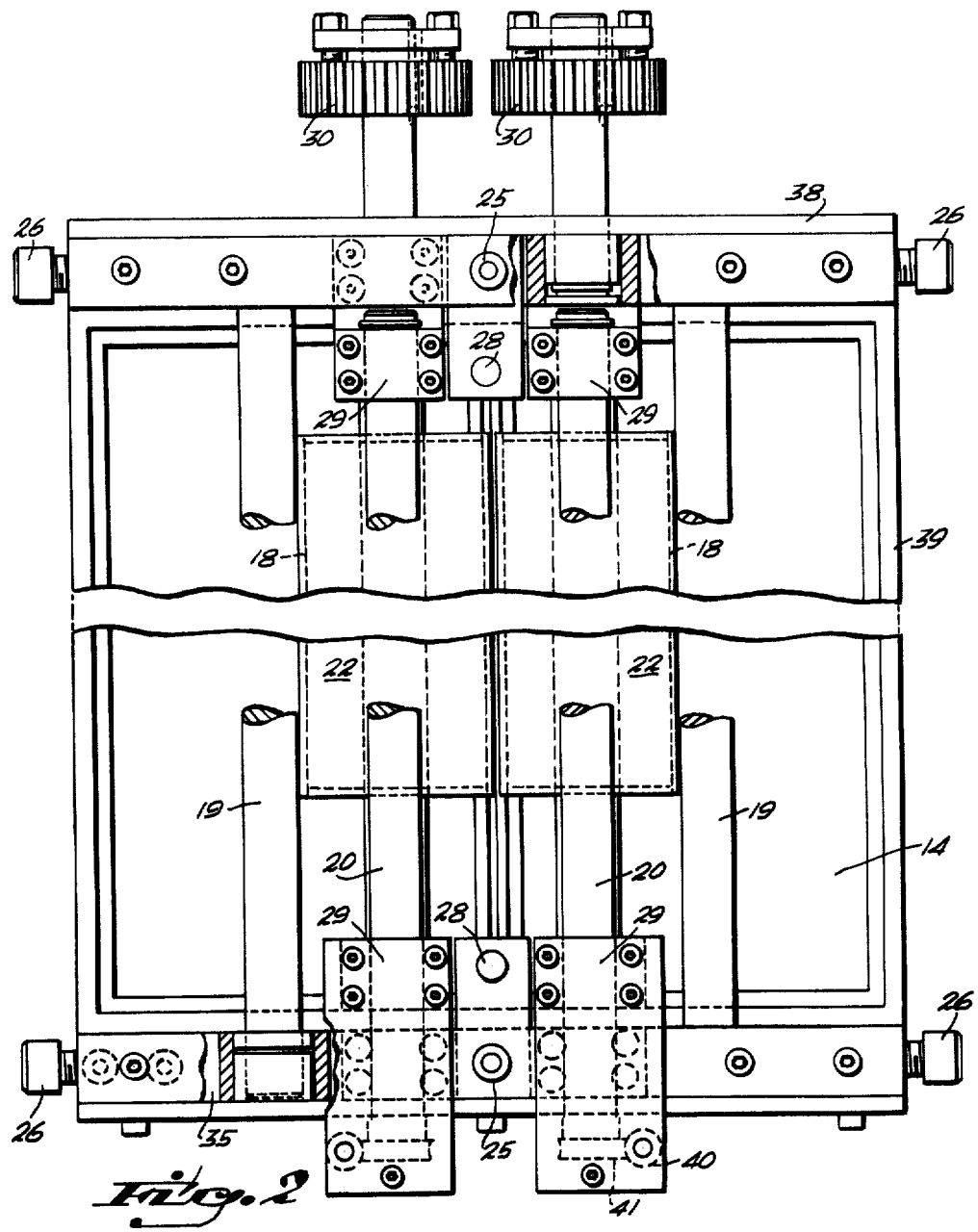
FIG. 2 is a plan view of the interior portion of the apparatus shown in FIG. 1 with the dust cover removed, and in a slightly enlarged scale from that shown in FIG. 1.
Figure 3:
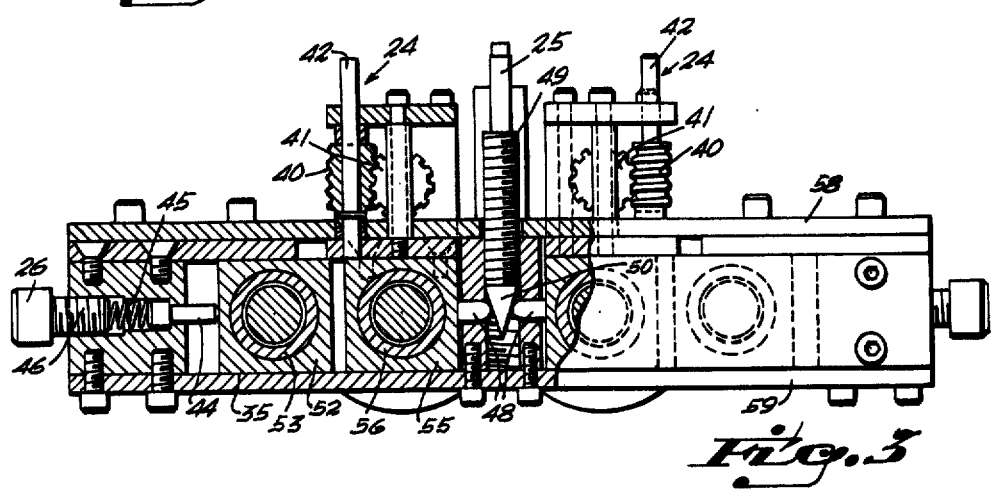
FIG. 3 is a partially sectioned transverse view of the apparatus shown in FIG. 2, taken from the lower end portion thereof and in the same scale therewith.

The interior operating members are best shown in FIGS. 2 and 3, where it will be seen that an outerside retainer 36 and an innerside retainer 38 provide the two end elements of the unit. The frame 39 supports the balance of the operating elements. The plating tank 14, of course, is at a lower portion of the frame 39.

The details of the mask adjuster 24 are shown in FIG. 3 where it will be seen that the shaft 42 drives a worm 40 which in turn engages a worm gear 41 on the end of the shaft of the masking roller 20. By rotating the shaft 42, the masking roller 20 can also be rotated, and the mask 21 raised or lowered into its desired opposed relationship between the plating rollers 18.

The yieldable pressure-like adjustment of the metering rollers 19 is provided by means of the compression of the spring 45 to the metering roll plunger 44 as shown in the left-end portion of FIG. 3. By rotating the metering roller adjustment 26, its threaded shaft 46 moves forwardly or rearwardly and increases or decreases the compression of spring 45, thereby varying the pressure translated through the plunger 44 to the metering roll bearing blocks 52. A Teflon way 35 is preferably provided beneath the bearing blocks 52, 55 so that they can be readily slidably adjusted. The plating roller adjustment 25 operates by means of a threaded shaft 49 having a cone 50 at its lower end portion which engages the roller plungers 48. The roller plungers 48, upon the advancement of the threaded shaft 49, press the roller bearing blocks 55 outwardly, and this motion is translated through the plating roller bearing 56 to separate the plating rollers 18. Thus, both the plating rollers 18 and the metering rollers 19 are suspended for rotation by means of sealed bearings 53, 56. The end portions of the frame 39 are secured by the upper retainer 58 and the lower retainer 59. As pointed out above, the lower retainer 59 has a Teflon way 35 provided at its upper surface for purposes of permitting the bearing blocks 52, 55 to slide easily. Also to be noted, is the mask roller spacer 29 which is provided in such a fashion and secured to the plating roller bearing block 55 so that the plating roller and the masking roller 20 shift inwardly and outwardly together when the plating roller rotates.

In operation for purposes of servicing, the plater rollers can be removed by sliding the various shafts outwardly to disengage their drive means, and pull toward the operator to disengage the same from the bottom of the unit. All of the shafts have oil seals to protect the electrolyte from contamination by the bearing lubricants. The masking shaft 20 moves in unison with the roller 18 as pointed out above, also when the printed circuit board 1 is inserted and moved downwardly onto the stop 16. The rotation of the mask 21 around the masking shaft 20 can be changed, as well as the direction of rotation to adjust the same. The rotation of the plating rollers 18 is dependent upon the mode of operation, such as pointed out above being susceptible of reversal when completing the stroke. It is also possible, although less desirable in this construction to rotate both rollers in the same direction, or contra-rotate the same in the ejecting type direction, with a yieldable urging of the printed circuit board 1 onto the printed circuit board stop 16. Furthermore, while the stop 16 is shown as located in the plating tank 14, it will be appreciated that various other jigs, including automated conveyorized travel of the printed circuit board over the insert slots 15 would permit the board to be dropped into position, the jig at its upper end, and then removed.

Although particular embodiments of the invention have been shown and described in full here, there is no intention to thereby limit the invention to the details of such embodiments. On the contrary, the invention is to cover all modifications, alternatives, embodiments, usages and equivalents of a method and apparatus for plating as fall within the spirit and scope of the invention, specification and appended claims.

What is claimed as new and desired to be secured by Letters Patent of the United States is:

1. A method for exchanging metal on a workpiece, comprising the steps of:
   positioning a pair of horizontally disposed counterrotating rollers each of which is covered with a material capable of absorbing a fluid,
   positioning the rollers in tangential wiping contact with a workpiece which is inserted vertically therebetween,
   applying an electrolytic solution to said rollers from a location beneath the point of tangential contact,
   fixedly jigging and holding the workpiece stationary between said horizontal rollers to fix an area of tangential wiping metal exchange on the workpiece between the rollers,
   further positioning and orienting the jig so that the workpiece is in a vertical plane passing between the rollers and positioning the point of metal exchange in an area substantially perpendicular to the mutual diameters of the rollers,
   and timing the contact in relation to the concentration of fluid and work area contact proportional to the current whereby repeatable metal exchange may be achieved with a smooth surface aided by continuous wiping contact and fixed positioning.

2. In the method of claim 1 above,
wherein said jig is positioned out of contact with fluid electrolyte whereby only electrolyte is transferred from the rollers.

3. In the method of claim 1,
the additional step of positioning said rollers at their lower portion in a fluid solution, and expressing the fluid therefrom by means of opposed squeezable metering rollers yieldably adjustable to empirically determine the quantity of electrolytic fluid on the rollers.

4. In the method of claim 1 above,
employing a method to fingerplate a printed circuit board,
utilizing a solution which, when the printed circuit board is the cathode and the solution is the anode, will transfer gold to a discreet area of the printed circuit board.

5. In the method of claim 1 above,
positioning metering rollers in frictional compressive rolling engagement with plating rollers,
adjusting the pressure of the metering rollers against said horizontally opposed rotating rollers to determine the amount of fluid retained in the plating rollers,
translating the pressure between the metering rollers into contact pressure between the horizontally opposed rotating rollers to thereby determine the extent of frictional engagement on the workpiece, and
predetermining the amount of fluid to be expressed from the plating roller so that a replenishment of the fluid is constantly washed onto the roller.

6. In the method of claim 1 above,
adjusting the horizontally opposed rotating rollers at their opposed ends to accommodate varying thickness along the roller attributable to the roller size and workpiece.

7. In the method of claim 5 above,
adjusting the horizontally opposed rotating rollers at their opposed ends to accommodate varying thickness along the roller attributable to the roller size and workpiece.

8. In the method of claim 1 above,
masking the workpiece above the point of tangency, whereby the line of metal exchange is controlled by the masks and wiping.

9. A method of controlling the area of metal exchange in a workpiece, comprising the steps of:
providing horizontally opposed counter-rotating rollers having an absorbent surface,
soaking the counter-rotating rollers with an electrochemical solution at the lower portion thereof,
positioning the rollers in yieldable frictional wiping contact at a tangent point between the two which is a tangent point for a work piece,
frictionally and wipingly inducing contact with the solution and the workpiece at the tangent point with the work piece being fixedly secured in a position substantially perpendicular to the diameters at the tangent point,
providing a solution for wetting the rollers which will assist in accomplishing metal exchange,
positioning metering means to stations opposed from the point of tangency between the two rollers for reducing the solution content in the roller, and
holding the workpiece stationary on a fixed jig in wiping tangential frictional engagement with the rollers for a period of time accommodating the concentration of fluid and work area contact proportional to the current to, based upon maintaining such properties constant, repeatably conduct a metal exchange at the surface of the workpiece.

10. In the method of claim 9,
the additional step of positioning said rollers at their lower portion in a fluid solution, and expressing the fluid therefrom by means of opposed squeezable metering rollers yieldably adjustable to empirically determine the quantity of electrolytic fluid on the rollers.

11. In the method of claim 9 above,
employing a method to fingerplate a printed circuit board,
utilizing a solution which, when the printed circuit board is the cathode and the solution is the anode, will transfer gold to a discreet area of the printed circuit board.

12. In the method of claim 9 above,
positioning metering rollers in frictional compressive rolling engagement with plating rollers,
adjusting the pressure of the metering rollers against said horizontally opposed rotating rollers to determine the amount of fluid retained in the plating rollers,
translating the pressure between the metering rollers into contact pressure between the horizontally opposed rotating rollers to thereby determine the extent of frictional engagement on the workpiece, and
predetermining the amount of fluid to be expressed from the plating roller so that a replenishment of the fluid is constantly washed onto the roller.

13. In the method of claim 9 above,
adjusting the horizontally opposed rotating rollers at their opposed ends to accommodate varying thickness along the roller attributable to the roller size and workpiece.

14. In the method of claim 12 above,
adjusting the horizontally opposed rotating rollers at their opposed ends to accommodate varying thickness along the roller attributable to the roller size and workpiece.

15. In the method of claim 9 above,
masking the workpiece above the point of tangency, whereby the line of metal exchange is controlled by the masks and wiping.

* * * * *